United States Patent
Kundu et al.

(10) Patent No.: US 12,154,794 B2
(45) Date of Patent: Nov. 26, 2024

(54) METHOD OF ETCHING AN INDIUM GALLIUM ZINC OXIDE (IGZO) STRUCTURE

(71) Applicant: IMEC vzw, Leuven (BE)

(72) Inventors: Shreya Kundu, Herent (BE); Frederic Lazzarino, Hamme-Mille (BE)

(73) Assignee: IMEC VZW, Leuven (BE)

( * ) Notice: Subject to any disclaimer, the term of this patent is extended or adjusted under 35 U.S.C. 154(b) by 478 days.

(21) Appl. No.: 17/451,454

(22) Filed: Oct. 19, 2021

(65) Prior Publication Data
US 2022/0130681 A1    Apr. 28, 2022

(30) Foreign Application Priority Data
Oct. 23, 2020   (EP) ..................... 20203548

(51) Int. Cl.
*H01L 21/465*    (2006.01)

(52) U.S. Cl.
CPC ................. *H01L 21/465* (2013.01)

(58) Field of Classification Search
CPC ... H01L 21/00–60292; H01L 21/67069; C25F 3/02–14; H01J 2237/334–3348
See application file for complete search history.

(56) References Cited

U.S. PATENT DOCUMENTS

| | | | |
|---|---|---|---|
| 2007/0287296 A1* | 12/2007 | Chang | H01L 29/7869 438/706 |
| 2018/0342403 A1* | 11/2018 | Anthis | H01L 21/28194 |
| 2019/0131130 A1* | 5/2019 | Smith | C23C 16/52 |
| 2020/0006319 A1 | 1/2020 | Okuno et al. | |

FOREIGN PATENT DOCUMENTS

| | | | | |
|---|---|---|---|---|
| JP | 2019-197773 | | 11/2019 | |
| WO | WO-2019216092 A1 * | | 11/2019 | H01L 21/3065 |

OTHER PUBLICATIONS

Zheng et al., "Dry Etching Characteristics of Amorphous Indium-Gallium-Zinc-Oxide Thin Films", Plasma Science and Technology, vol. 14, No. 10, Oct. 2012, 4 pages.
Extended European Search Report dated Apr. 26, 2021 in European Application No. 20203548.1 in 9 pages.

* cited by examiner

*Primary Examiner* — Shahed Ahmed
*Assistant Examiner* — Rhys Poniente Sheker
(74) *Attorney, Agent, or Firm* — Knobbe, Martens, Olson & Bear, LLP

(57) ABSTRACT

A method of etching an indium gallium zinc oxide (IGZO) structure is provided. In one aspect, the method includes exposing the IGZO structure to a reactant flow including a hydrocarbon-based reactant. Thereby, a reactant layer is formed on the IGZO structure. The method also includes exposing the reactant layer formed on the IGZO structure to an argon flow. Thereby, one or more reactant molecules are removed from the reactant layer. The one or more reactant molecules, which are removed from the reactant layer formed on the IGZO structure, are removed together with one or more IGZO molecules, thus leading to an etching of the IGZO structure.

19 Claims, 7 Drawing Sheets

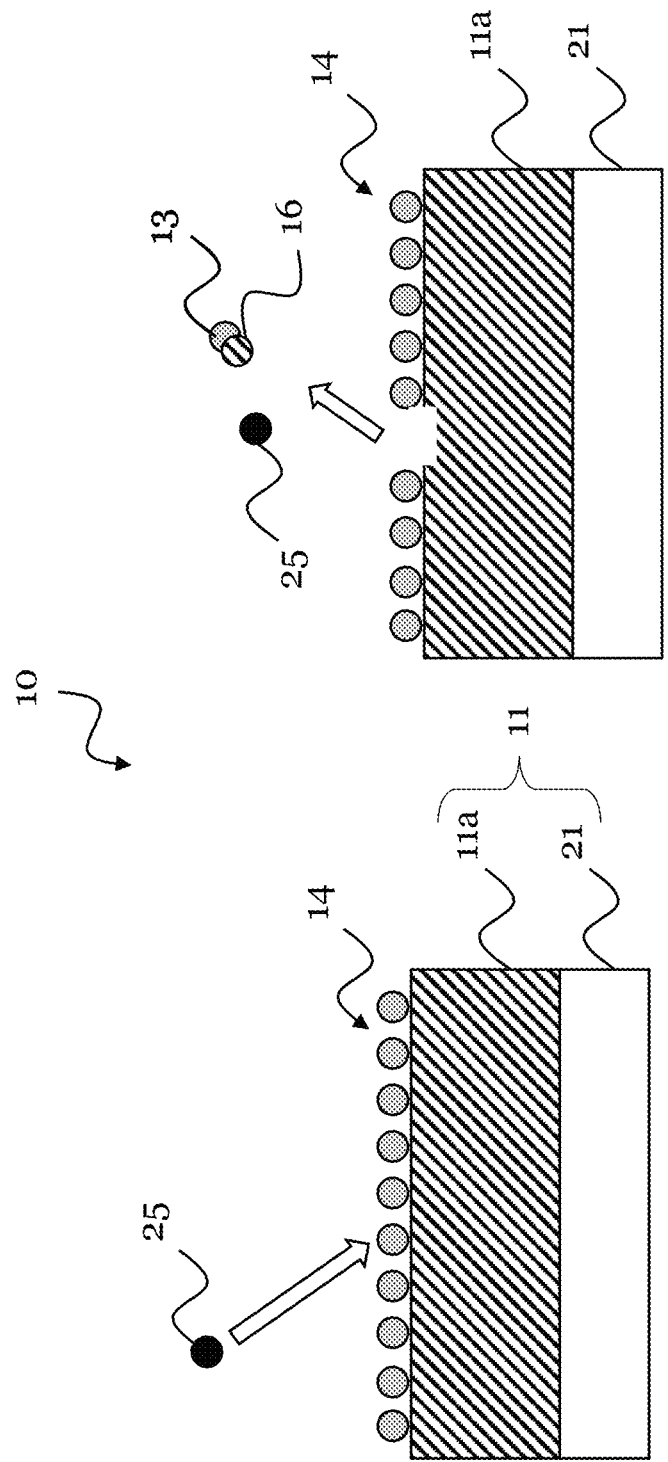

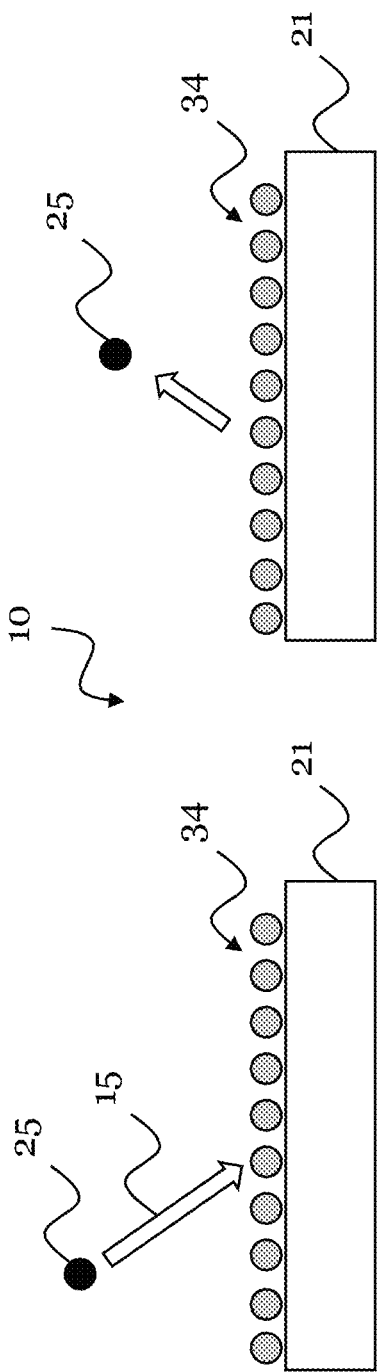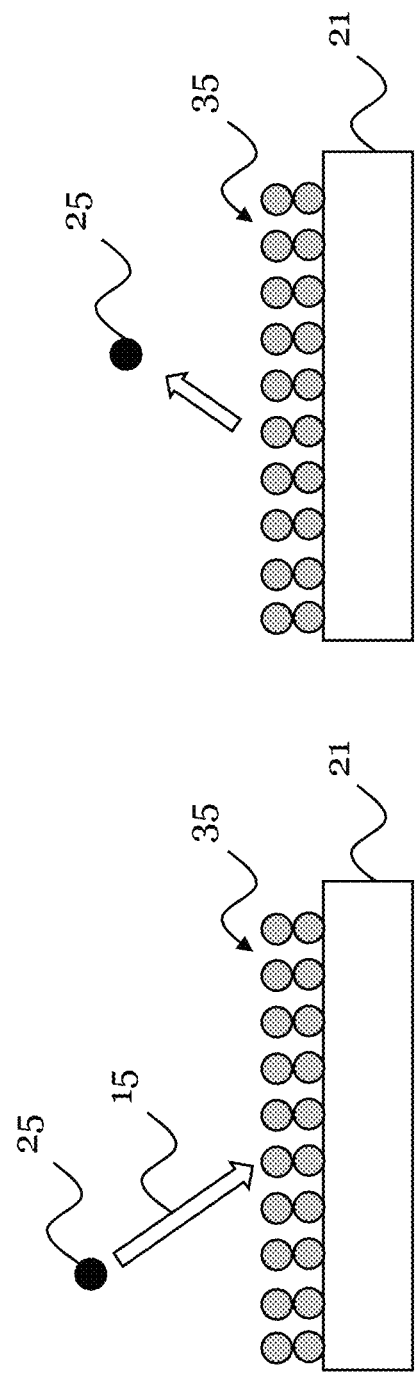

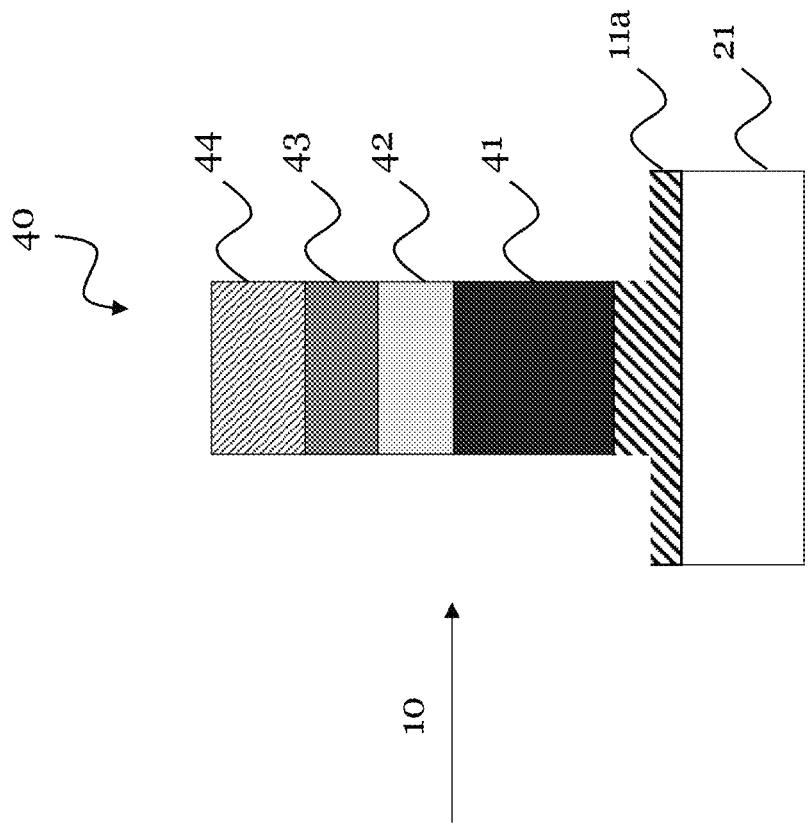
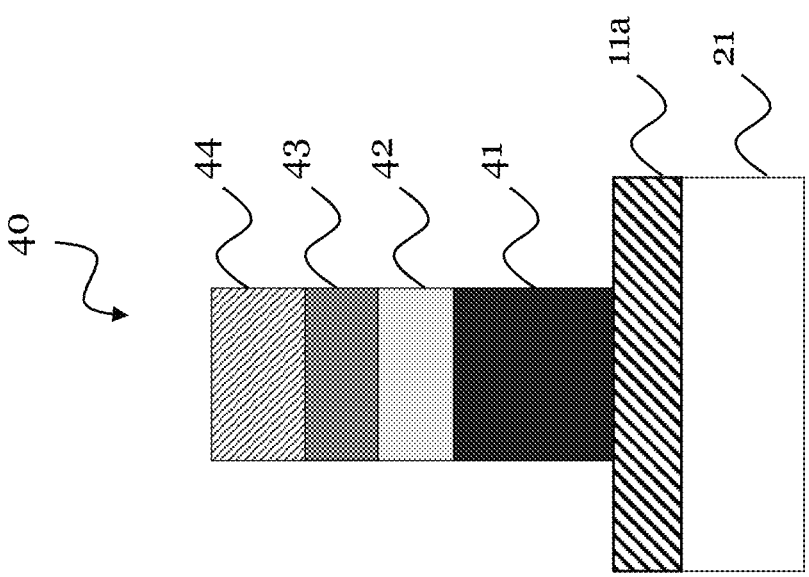

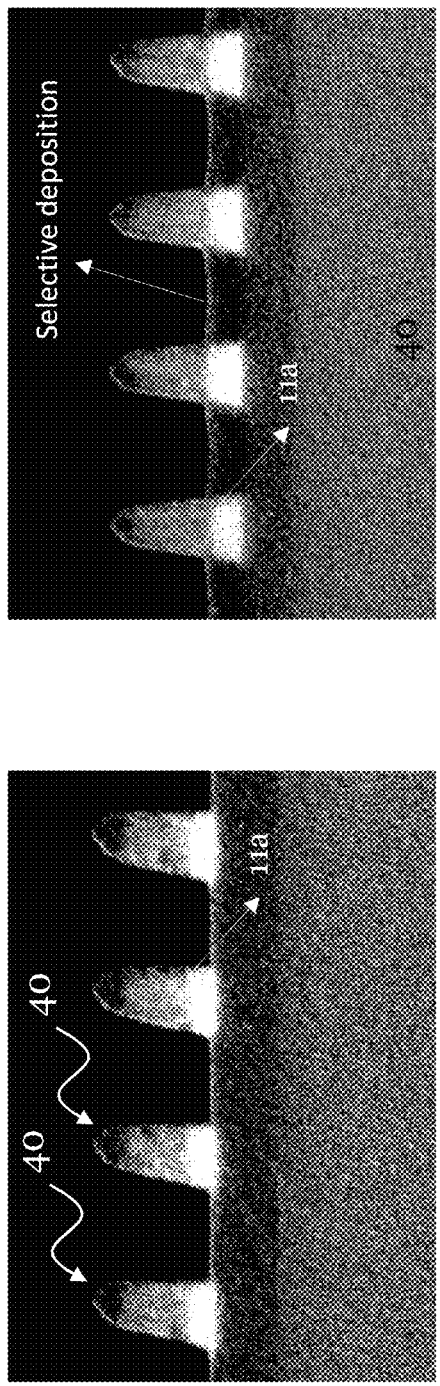

METHOD OF ETCHING AN INDIUM GALLIUM ZINC OXIDE (IGZO) STRUCTURE

CROSS-REFERENCE TO RELATED APPLICATIONS

This application claims foreign priority to European Patent Application No. EP 20203548.1, filed Oct. 23, 2020, the content of which is incorporated by reference herein in its entirety.

BACKGROUND

Technical Field

The disclosed technology generally relates to a method of etching an indium gallium zinc oxide (IGZO) structure. The method can include exposing the IGZO structure to first a reactant flow and then an argon flow. The exposure of the IGZO structure to, respectively, the reactant flow and the argon flow may be repeated one or more times, in order to etch the IGZO structure.

Description of the Related Technology

IGZO is an alloy, which is considered as a next generation candidate for thin film transistors, and provides multiple advantages. These advantages include that IGZO is a transparent material and is polycrystalline in nature. Thus, it may be used for fabricating flexible screens. Further, IGZO can allow for a high carrier mobility, a low thermal budget, and a high state retention.

For unlocking these advantages, IGZO patterning and its scaling can be significant. However, there are challenges in the patterning, in particular, in etching IGZO. In various instances, halogen-based chemistries (like using Cl—, Br—, or F—) cannot be well used for etching IGZO, since the metal-halogen interaction can lead to formation of non-volatile by-products.

Accordingly, there is a need to develop new etch methods for etching IGZO structures.

SUMMARY OF CERTAIN INVENTIVE ASPECTS

In an example method of etching an IGZO structure, a reactant including methane/argon ($CH_4/Ar$) is used, e.g., a non-halogen based chemical etch method is provided. However, the use of $CH_4/Ar$ may cause passivation of the etched IGZO, which passivation can act as an etch stop in the further etching process. The passivation in some such instances has to be removed, for instance, by an oxygen strip, before continuing the etching. In particular, etching steps and oxygen strips have to be used alternatingly. The etch stop can be more significant at tighter pitches (e.g., with thicker IGZO films), and may in this case prevent etching completely (e.g., not even an oxygen strip may be useful anymore). Overall, the example method is thus not well suited for etching the IGZO, especially in case of a high-density pattern etch with tight pitches.

In view of the above-mentioned disadvantages, embodiments of the disclosed technology aim to provide an improved method of etching an IGZO structure. An objective is, in particular, to provide an etch method, which can etch IGZO included by the IGZO structure efficiently. For instance, the method can be usable for performing a high-density pattern etch. Further, in various implementations, non-volatile by-products can be avoided when etching, e.g., only volatile etch products can be generated. The etch method can further provide accurate results, be well controllable, and simple to perform.

These and other objectives can be achieved by the embodiments of the disclosed technology provided in the enclosed independent claims. Advantageous implementations of these embodiments are defined in the dependent claims.

A first aspect of the disclosed technology provides a method of etching an IGZO structure. The method can include exposing the IGZO structure to a reactant flow including a hydrocarbon-based reactant, wherein a reactant layer is formed on the IGZO structure. The method can also include exposing the reactant layer formed on the IGZO structure to an argon flow, wherein one or more reactant molecules are removed from the reactant layer. The one or more reactant molecules, which are removed from the reactant layer formed on the IGZO structure, are removed together with one or more IGZO molecules.

By removing the one or more IGZO molecules together with the one or more reactant molecules, the IGZO structure is etched. The IGZO structure may be pure IGZO like an IGZO layer, or may be a structure including an IGZO surface like an IGZO layer on a substrate. The etching of the IGZO structure with the method of the first aspect can yield very accurate results, and can be well controlled, for example, by controlling the flow pressures and/or by repeating the steps of providing the two flows one or more times. In particular, low pressure flows are possible, allowing the etching of the IGZO structure to be controlled in the nanometer regime (or less).

The method of the first aspect also avoids that a passivation is formed on the etched IGZO structure, so that no etch stop is created, and accordingly no oxygen strip is necessary while performing the method. Deeper and thicker IGZO can thus be etched than with the example method described above. The method of the first aspect also does not require providing hydrogen, which is conventionally used separately or additionally used for etching. This is beneficial, since hydrogen can penetrate IGZO structures like IGZO films, and can cause doping, which would impact the electrical properties of the IGZO.

The method of the first aspect may include atomic layer etching (ALE), in particular, the reactant layer may be an atomic layer, and an atomic layer of IGZO may be removed from the IGZO structure together with removing the reactant layer.

In an implementation of the method, each reactant molecule is removed by interacting with an argon atom of the argon flow; and/or each removed reactant molecule is attached to an IGZO molecule.

In an implementation of the method, the reactant flow is provided with a pressure in a range of 10-30 mT, for example, with a pressure of about 20 mT; and/or the reactant flow is provided with a bias of 120 V or less, for example, with a bias of 100 V or less.

Accordingly, low pressure flows are possible with the method of the first aspect. This may provide better wafer to wafer uniformity.

In an implementation of the method, the reactant flow is provided with a bias of 0 V (zero V).

Accordingly, no bias is necessary to provide the reactant flow, while still achieving very good results of etching the IGZO structure.

In an implementation of the method, the argon flow is provided with a bias of 75 V or less, for example, with a bias of 60 V or less.

For instance, the bias may be 50V or less, or even 30V or less. Accordingly, a low bias argon flow can be used, while still achieving very good results of etching the IGZO structure.

In an implementation of the method, the reactant flow includes methane/argon or methane/helium as the hydrocarbon-based reactant.

In an implementation of the method, a ratio of methane to argon is in a range of 1:10-1:30, for example, about 1:20; or a ratio of methane to helium is in a range of 1:5-1:10, for example, about 1:8.

In an implementation of the method, the reactant layer formed on the IGZO structure is a reactant monolayer.

Thus, the etching of the IGZO structure can be performed with atomic layer precision.

In an implementation of the method, the steps of exposing the IGZO structure to the reactant flow and exposing the reactant layer formed on the IGZO structure to the argon flow are repeated one or more times.

In an implementation of the method, the steps are repeated 70 times or more, for example, 100 times or more.

In this way, deeper etch structures can be etched efficiently, without the need of any intermediated steps, like an oxygen strip.

In an implementation of the method, the IGZO structure includes an IGZO layer formed on a silicon-based substrate.

In an implementation, the method further includes exposing a region of the substrate, where the IGZO layer has been removed, to the reactant flow, wherein a reactant layer is formed on the substrate; and exposing the reactant layer formed on the substrate to the argon flow, wherein no reactant molecule is removed from the reactant layer formed on the substrate.

In an implementation, the method further includes exposing the region of the substrate, where the IGZO layer has been removed and the reactant layer has been formed, again to the reactant flow, wherein a second reactant layer is formed on the reactant layer formed on the substrate.

According to the above implementations, a selective deposition of one or more reactant layers may be provided to protect the substrate and IGZO structure, and to enable planarization.

In an implementation, the method is performed at a temperature of 100° C. or more, for example, at a temperature of 120° C. or more.

A second aspect of the disclosed technology provides an IGZO structure formed by using the method according to the first aspect or any implementation thereof.

The IGZO structure of the second aspect benefits from the advantages described for the method of the first aspect as well as other advantages, and may be implemented according to the respective implementations as described above for the device of the first aspect. The IGZO structure may, particularly, be provided with a high-density etch.

BRIEF DESCRIPTION OF THE DRAWINGS

The above described aspects and implementations are explained in the following description of embodiments with respect to the enclosed drawings:

FIGS. 2A and 2B illustrate steps of a method according to an embodiment of the disclosed technology.

FIGS. 3A, 3B, 3C, and 3D illustrate further steps of a method according to an embodiment of the disclosed technology.

FIGS. 4A and 4B show an IGZO structure produced by a method according to an embodiment of the disclosed technology.

FIGS. 7A and 7B show results of etching an IGZO structure with a method according to an embodiment of the disclosed technology.

DETAILED DESCRIPTION OF CERTAIN ILLUSTRATIVE EMBODIMENTS

FIGS. 1A, 1B, 1C, and 1D show schematically a method 10 according to an embodiment of the disclosed technology. The method 10 is used for etching an IGZO structure 11, wherein the IGZO structure includes at least an IGZO (or IGZO-based) layer or another IGZO element. The IGZO structure 11 may also include an IGZO layer (or IGZO-based layer) provided on a substrate (as shown in FIGS. 3A-3D and FIGS. 4A-4B), wherein specifically the IGZO layer (or IGZO-based layer) may be etched.

Figure 1A:
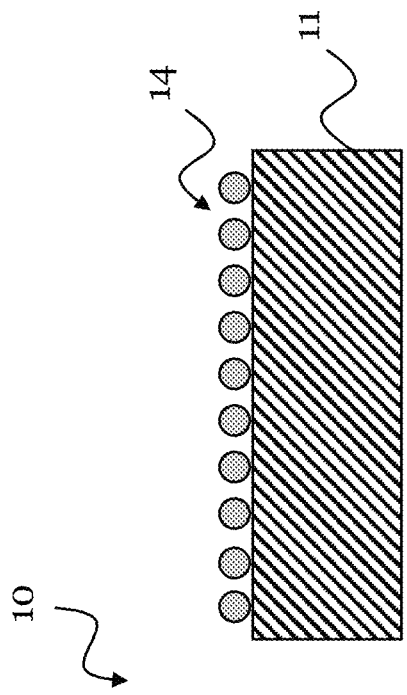
FIGS. 1A, 1B, 1C, and 1D illustrate steps of a method according to an embodiment of the disclosed technology.
Figure 1C:
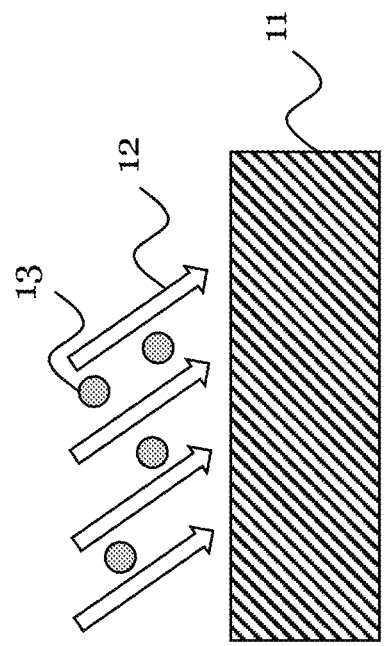
Figure 1B:
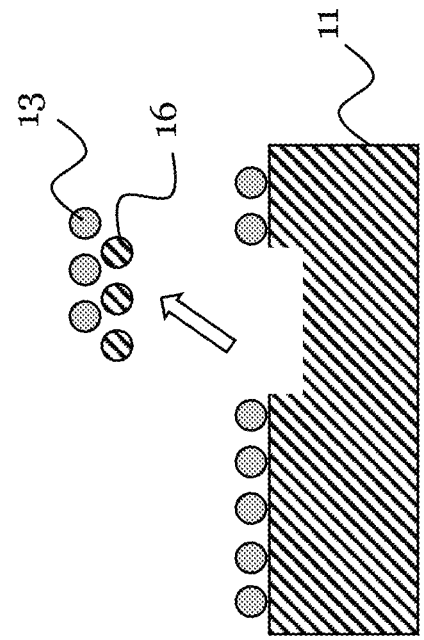

The method 10 includes a first step (shown in FIG. 1A) of exposing the IGZO structure 10 to a reactant flow 12. The reactant flow 12 includes a reactant, for example, reactant atoms or molecules, such as ions (indicated as grey circles 13). In particular, the reactant flow 12 includes a hydrocarbon-based reactant, for example, a methane-based reactant. For instance, the hydrocarbon-based reactant may include methane/argon ($CH_4$/Ar). A ratio of methane to argon may be in a range of 1:10-1:30, for example, the ratio may be about 1:20. The exposure of the IGZO structure 11 to the reactant flow 12 leads to a reactant layer 14 being formed on the IGZO structure 11 (as shown in FIG. 1B). In some embodiments, it is possible that a monolayer of reactant is formed on the IGZO structure 11.

Figure 1D:
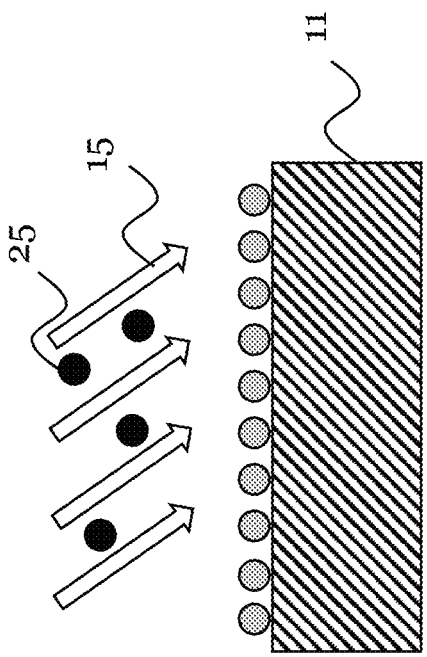

The method 10 includes a second step (shown in FIG. 1C) of exposing the reactant layer 14, which is formed on the IGZO structure 11, to an argon flow 15. The argon flow 15 may include argon atoms, such as ions (indicated as black circles 25). By exposing the reactant layer 14 to the argon flow 15, one or more reactant molecules 13 are removed from the reactant layer 14 (as shown in FIG. 1D). Thereby, the one or more reactant molecules 13, which are removed from the reactant layer 14 formed on the IGZO structure 11, are removed together with one or more IGZO molecules 16.

In this way, a highly-controlled etch of the IGZO structure 11 is provided. The IGZO structure 11 can be patterned by using the method 10 according to an embodiment. In various implementations, no oxygen strip is involved in between the steps of the method 10 (as can be seen in FIG. 1A-D).

FIGS. 2A-2B and 3A-3D show schematically a method 10 according to an embodiment of the disclosed technology, which builds on the embodiment shown in FIGS. 1A-1D. Same steps and elements are labelled with the same reference signs, and may be implemented likewise.

In particular, FIGS. 2A-2B show that the IGZO structure 11 includes an IGZO layer 11a and a substrate 21, for instance, a silicon-based substrate. The silicon-based substrate may include silicon, and/or silicon dioxide, and/or silicon nitride.

FIG. 2A shows that in a first step of the method 10 (in-line with FIG. 1A and FIG. 1B), the reactant flow 12 has been provided onto the IGZO structure 11, particularly, the IGZO layer 11a, and the reactant layer 14 has been formed.

For instance, in this first step (which may be considered a first step of ALE), the hydrocarbon-based reactant may include methane/helium ($CH_4$/He). The ratio of methane to helium may be in a range of 1:5-1:10, for example, the ratio may be about 1:8. The $CH_4$/He flow 12 may have a low pressure and/or a low bias. For example, the pressure may be in a range of 10-30 mT, for example, the pressure may be about 20 mT. Notably, also $CH_4$/Ar may be used as described with respect to FIGS. 1A-1D. The reactant flow 12 may be provided with a bias of 120 V or less, for example, with a bias of 100 V or less, or may even be provided with a zero bias (0 V). The probability that a monolayer is formed as the reactant layer 14 is high under these conditions, and is shown in FIG. 2A.

FIG. 2A shows further that in a second step of the method 10 (in-line with FIG. 1C and FIG. 1D), the argon flow 15 is provided onto the reactant layer 14, which is formed on the IGZO structure 11. The argon flow 15 includes argon atoms 25, such as ions. The argon atoms 25 interact with the reactant layer 14, causing one or more reactant molecules 13 to be removed from the reactant layer 14. The one or more reactant molecules 13 are removed together with one or more IGZO molecules 16. In particular, each reactant molecule 13 may be removed by interacting with an argon atom 25 of the argon flow 15. Further, as shown, each removed reactant molecule 13 may be attached to an IGZO molecule 16. Thereby, the IGZO layer 11a is etched.

For instance, in this second step (which may be considered a second step of ALE), a low-biased argon flow 15 may be provided. The bias of the argon flow 15 may be 75 V or less, for example, may be 60 V or less, or even 50V or less.

Figures 1, 5A:
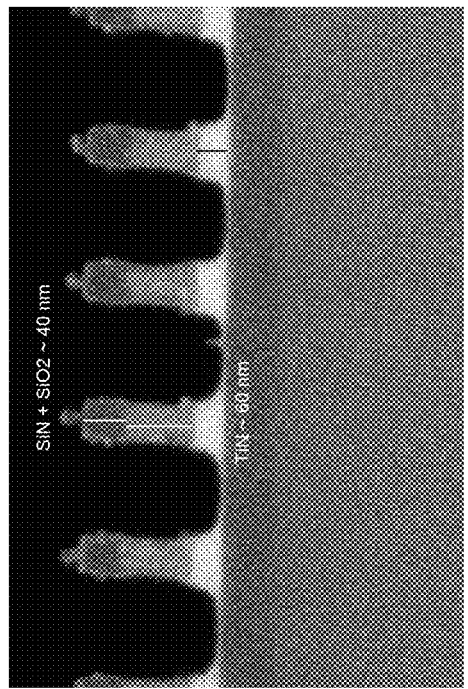
FIGS. 5A-1, 5A-2, 5B-1, and 5B-2 show results of etching an IGZO structure with an example method.
Figures 2, 5A:
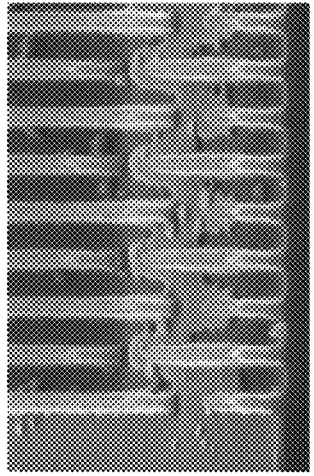

The first and second steps of the method 10 according to embodiments of the disclosed technology (as shown in FIGS. 1-3) may be repeated. For example, the steps of exposing the IGZO structure 11 to the reactant flow 12 and of subsequently exposing the reactant layer 14 formed on the IGZO structure 11 to the argon flow 15 may be repeated one or more times. For example, the steps may be performed in total 70 times or more, or even 100 times or more.

FIG. 3A illustrates the situation after full IGZO patterning in some implementations. For example, FIG. 3A shows that the IGZO layer 11a has been removed completely (at least in the illustrated region of the IGZO structure 11) from the substrate 21. Further, the first step of the method 10 of providing the reactant flow 12 has been carried out once more. For example, the region of the substrate 21, where the IGZO layer 11a has been completely removed, was exposed to the reactant flow 12. Thereby, a reactant layer 34 was formed on the substrate 21. In particular, for the hydrocarbon-based reactant, this may be due to hydrocarbon adsorption on the substrate 21.

FIG. 3A and FIG. 3B also show that the second step of the method 10 is carried out once more. For example, the reactant layer 34 formed on the substrate 21 is exposed to the argon flow 15. In this example, no reactant molecule is removed from the reactant layer 34 formed on the substrate 21. Accordingly, also no substrate material (e.g. silicon or silicon dioxide) is removed.

FIG. 3C shows that the first step of the method 10 can be repeated again. For example, the region of the substrate 21, where the IGZO layer 11a has been removed and the reactant layer 34 has subsequently been formed, can be exposed again to the reactant flow 15. Thereby, a second reactant layer 35 is formed on the reactant layer 34 formed on the substrate 21. FIG. 3C and FIG. 3D show that also the second step 10 of the method can be repeated again. Thereby, no reactant molecule or substrate material is removed, when exposing the second reactant layer 35 to the argon flow 15, leading to two reactant layers 34, 35 formed on top of each other. The reactant layer 34 and/or the second reactant layer 35 may be a monolayer. In the same way, also three or more reactant layers 34, 35 may be formed. The reactant layers 34, 35 may protect the substrate 21.

Notably, the above-described method 10 according to all described embodiments of the disclosed technology may be performed at a temperature of 100° C. or more, for example, at a temperature of 120° C. or more.

FIGS. 4A and 4B show an example of a stack 40 including an IGZO structure 11, particularly, these figures show an example integration stack 40 that employs IGZO. In particular, the stack 40 may be suitable for building an IGZO-based transistor. The stack 40 may include the substrate 21 and the IGZO layer 11a provided on the substrate 21. The IGZO layer 11a may have a thickness of around 30 nm (wherein thickness is along the growth direction/vertical direction in FIGS. 1A-1D). Further, the stack 40 may include a hardmask layer 41 (for example, a titanium nitride layer, which may have a thickness of around 60 nm) provided on the IGZO layer 11a. Further, the stack 40 may include a silicon nitride layer 42 (for example, having a thickness of around 20 nm) provided on the hardmask layer 41, and further an oxide layer 43 (for example, having a thickness of around 20 nm) provided on the silicon nitride layer 42. The stack 40 may also include an advanced patterning (or advanced patterning film (APF)) layer 44 (for example, having a thickness of around or below 70 nm) provided on the oxide layer 43. The layers 41, 42, 43 and 44 may be formed or structured as a pillar (for example, standing) on the IGZO layer 11a. The stack 40 may have a critical dimension (CD) of 45 nm, and may be fabricated with a pitch of 135 nm.

FIG. 4A and FIG. 4B illustrate, in comparison to another, how the IGZO layer 11a may be etched by using the method 10 according to embodiments of the disclosed technology (as described above). In particular, the IGZO layer 11a of the stack 40 may be patterned around the pillar composed by the layers 41, 42, 43, and 44 of the stack 40.

FIGS. 5A-1, 5A-2, 5B-1, and FIG. 5B-2 show results of etching an IGZO structure with an example conventional method, as described in the Summary section. In particular, a structure including multiple pillars provided in a high-density arrangement on a substrate (shown in images) is etched. The pillars include an IGZO layer in the bottom part (bright portion). Each of the multiple pillars with the substrate resembles a stack similar to stack 40 shown in FIGS. 4A-4B.

In particular, for the example method related to FIGS. 5A-1 and 5A-2, $CH_4$/Ar was used as a reactant and provided by Reactive Ion Etching (RIE) onto IGZO. A pressure of 20 mT was thereby used, and a 100 V bias. The step was carried out at 90° C. (for 300 s), and was followed by an oxygen strip. This example method leads to unwanted residues and uncontrolled film growth not caused by the etch process.

Figures 1, 5B:
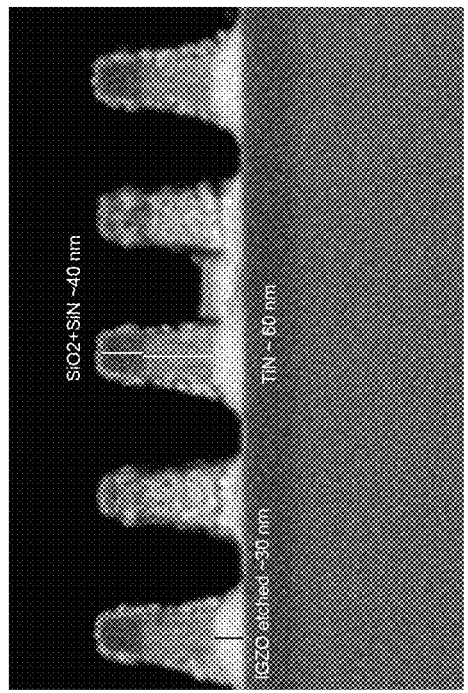
Figures 2, 5B:
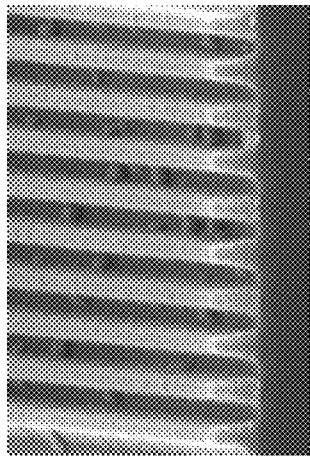

For the example method related to FIGS. 5B-1 and 5B-2, $CH_4$/Ar was also used as a reactant and was again provided by RIE. A pressure of 50 mT was used and a 100 V bias. The step was carried out at 90° C. (for 300 s), and was followed by an oxygen strip. This example method leads to a significant loading effect, thus making it unsuitable for etching, particularly, high-density structures.

Figure 6A:
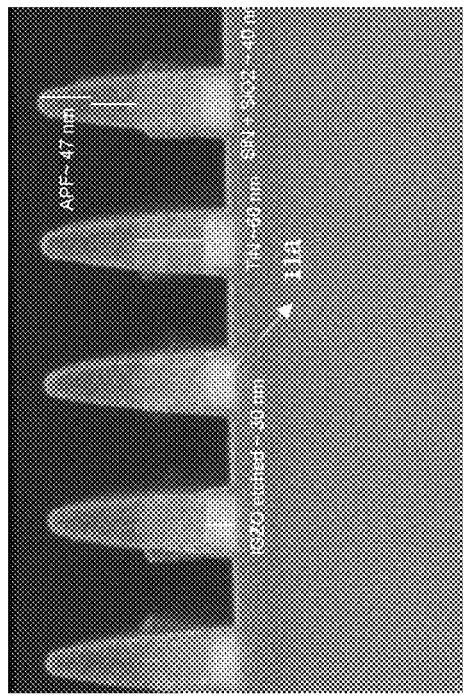
FIGS. 6A and 6B show results of etching an IGZO structure with a method according to an embodiment of the disclosed technology.
Figure 6B:
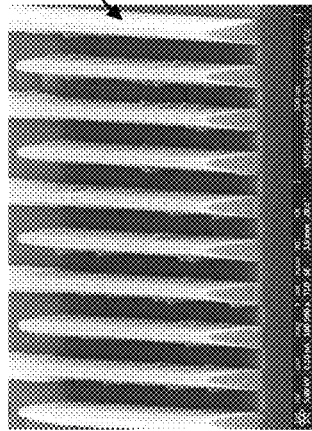

FIGS. 6A and 6B show results of etching an IGZO structure 11 with a method 10 according to an embodiment of the disclosed technology. In particular, the first step (for example, chemisorption) of the method 10 used $CH_4$/Ar as the hydrocarbon-based reactant in the reactant flow 12. A pressure of 20 mT was thereby used and a 0 V bias. The step was carried out at 120° C. (for 5 s). The first step was followed by the second step (for example, removal) of the method 10, wherein the Ar flow 15 is provided. A pressure of 10 mT was used and a 100 V bias. The second step was carried out at 120° C. (for 5 s). About 70 cycles of the first step and the second step were performed. The method 10 leads to an improved etching, particularly, when etching high-density structures as shown. Further, the oxygen strip of the example method could be eliminated.

FIG. 7A and FIG. 7B show results of etching an IGZO structure with a method 10 according to an embodiment of the disclosed technology. In particular, the first step of the method 10 used $CH_4$/He as the hydrocarbon-based reactant in the reactant flow 12. A pressure of 20 mT was used and a 100 V bias. The first step was carried out at 120° C. (for 5 s). The first step was followed by the second step of the method 10, wherein the Ar flow 15 is provided. A pressure of 10 mT was used and a 100 V bias. The second step was carried out at 120° C. (for 5 s). About 40 cycles of the first step and the second step were performed. In some implementations, this method 10, due to using helium for the hydrocarbon-based reactant, leads to an improved ionization (compared with using Ar for the hydrocarbon-based reactant), and thus to a higher throughput. The method 10, if performed in-line with FIG. 3A-D, may also lead to selective deposition (shown in FIG. 7B), thus, providing a good source of passivation.

In FIGS. 6A-6B and FIGS. 7A-7B, a structure including multiple pillars provided in a high-density arrangement on a substrate (shown in images) is etched. The pillars include an IGZO layer in the bottom part (bright portion, like that shown for the example method in FIGS. 5A-1, 5A-2, 5B-1, and 5B-2). Each of the multiple pillars with the substrate resembles a stack similar to stack 40 shown in FIGS. 4A-4B.

In summary, the disclosed technology provides a method 10 of etching an IGZO structure 10. The method 10 according to embodiments of the disclosed technology improves methods for etching IGZO. The method 10 can allow patterning IGZO and its scaling. Accordingly, the advantages of the IGZO can be employed thanks to the method 10.

What is claimed is:

1. A method of etching an indium gallium zinc oxide (IGZO) structure, the method comprising:
    exposing the IGZO structure to a reactant flow comprising a hydrocarbon-based reactant, wherein a non-halogen based reactant monolayer is formed on the IGZO structure; and
    exposing the reactant monolayer formed on the IGZO structure to an argon flow, wherein one or more reactant molecules are removed from the reactant monolayer,
    wherein the one or more reactant molecules, which are removed from the reactant monolayer formed on the IGZO structure, are removed together with one or more IGZO molecules.

2. The method according to claim 1, wherein:
    each reactant molecule is removed by interacting with an argon atom of the argon flow; and/or
    each removed reactant molecule is attached to an IGZO molecule.

3. The method according to claim 1, wherein:
    the reactant flow is provided with a pressure in a range of 10-30 mT; and/or
    the reactant flow is provided with a bias of 120 V or less.

4. The method according to claim 3, wherein:
    the reactant flow is provided with a pressure of about 20 mT; and/or
    the reactant flow is provided with a bias of 100 V or less.

5. The method according to claim 1, wherein the reactant flow is provided with a bias of 0 V.

6. The method according to claim 1, wherein the argon flow is provided with a bias of 75 V or less.

7. The method according to claim 6, wherein the argon flow is provided with a bias of 60 V or less.

8. The method according to claim 1, wherein the reactant flow comprises methane/argon or methane/helium as the hydrocarbon-based reactant.

9. The method according to claim 8, wherein:
    a ratio of methane to argon is in a range of 1:10-1:30; or
    a ratio of methane to helium is in a range of 1:5-1:10.

10. The method according to claim 9, wherein:
    a ratio of methane to argon is about 1:20; or
    a ratio of methane to helium is about 1:8.

11. The method according to claim 1, wherein exposing the IGZO structure to the reactant flow and exposing the reactant monolayer formed on the IGZO structure to the argon flow are repeated one or more times.

12. The method according to claim 11, wherein exposing the IGZO structure to the reactant flow and exposing the reactant monolayer formed on the IGZO structure to the argon flow are repeated 70 times or more.

13. The method according to claim 12, wherein exposing the IGZO structure to the reactant flow and exposing the reactant monolayer formed on the IGZO structure to the argon flow are repeated 100 times or more.

14. The method according to claim 1, wherein the IGZO structure comprises an IGZO formed on a silicon-based substrate.

15. The method according to claim 14, further comprising:
    exposing a region of the substrate, where the IGZO layer has been removed, to the reactant flow, wherein a reactant layer is formed on the substrate; and
    exposing the reactant formed on the substrate to the argon flow, wherein no reactant molecule is removed from the reactant formed on the substrate.

16. The method according to claim 15, further comprising:
    exposing the region of the substrate, where the IGZO layer has been removed and the reactant layer has been formed, again to the reactant flow, wherein a second reactant layer is formed on the reactant formed on the substrate.

17. The method according to claim 1, wherein the method is performed at a temperature of 100° C. or more.

18. The method according to claim 17, wherein the method is performed at a temperature of 120° C. or more.

19. An IGZO structure formed by using the method according to claim 1.

* * * * *

UNITED STATES PATENT AND TRADEMARK OFFICE
CERTIFICATE OF CORRECTION

PATENT NO. : 12,154,794 B2
APPLICATION NO. : 17/451454
DATED : November 26, 2024
INVENTOR(S) : Shreya Kundu et al.

It is certified that error appears in the above-identified patent and that said Letters Patent is hereby corrected as shown below:

In the Claims

Column 8, Claim 14, Line 40 (approx.), "IGZO formed" and insert -- IGZO layer formed --.

Column 8, Claim 15, Line 47 (approx.), delete "reactant formed" and insert -- reactant layer formed --.

Column 8, Claim 15, Line 49 (approx.), delete "reactant formed" and insert -- reactant layer formed --.

Column 8, Claim 16, Line 55 (approx.), delete "reactant formed" and insert -- reactant layer formed --.

Signed and Sealed this
Eleventh Day of February, 2025

Coke Morgan Stewart
*Acting Director of the United States Patent and Trademark Office*